United States Patent [19]

Kanda et al.

[11] Patent Number: 4,968,953
[45] Date of Patent: Nov. 6, 1990

[54] OSCILLATION CIRCUIT FOR PROXIMITY SWITCH

[75] Inventors: Yoshimi Kanda, Nagaokakyo; Akio Matsumoto, Takatsuki; Yasushi Matsuoka, Takatsuki; Tsutomu Ajioka, Takatsuki; Hirofumi Endo, Nagaokakyo; Satoshi Motouji, Kyoto, all of Japan

[73] Assignee: Omron Tateisi Electronics Co., Kyoto, Japan

[21] Appl. No.: 440,329

[22] Filed: Nov. 22, 1989

[30] Foreign Application Priority Data

Nov. 30, 1988 [JP] Japan .................................. 63-300818

[51] Int. Cl.$^5$ ............................ G01V 3/11; H03B 5/12
[52] U.S. Cl. .................................. 331/65; 324/207.16;
324/236; 361/180; 331/117 R
[58] Field of Search ............... 331/65, 117 R, 117 FE;
324/207.16, 236, 237, 327; 340/941, 551, 552;
361/180, 203

[56] References Cited

U.S. PATENT DOCUMENTS 4,761,603 8/1988 Nodera ............................. 331/65 X Primary Examiner—Siegfried H. Grimm
Attorney, Agent, or Firm—Dickstein, Shapiro & Morin

[57] ABSTRACT

An oscillation circuit of a proximity switch includes a parallel LC resonance circuit (L, C), an oscillation transistor (Tr6) controlled by an output voltage from the resonance circuit for switching a constant current and a feedback circuit (Tr2, Tr3) for feeding back a current flowing through the oscillation transistor to the resonance circuit. In the circuit, there is further disposed a feedback current increase circuit including a second transistor (Tr7) controlled by an output voltage from the resonance circuit and a resistor (R) connected in series to the second transistor. The resonance circuit is supplied via the feedback circuit with a feedback current obtained by adding a current flowing through the feedback current increase circuit and a current passing through the oscillation transistor, thereby developing a large change in the amplitude of the oscillation.

2 Claims, 3 Drawing Sheets

OSCILLATION CIRCUIT FOR PROXIMITY SWITCH

BACKGROUND OF THE INVENTION

1. Field of the Invention

The present invention relates to an oscillation circuit for a proximity switch in which an amplitude of an oscillation varies in response to approach of an object to be sensed.

2. Related Art

It has been recently required to provide a proximy switch with a setting display function. With this function, a distance in which an object can be sensed with a high stability (e.g. a distance of about 80% of the maximum distance for sensing an object) is displayed. For the provision of the display function, it is necessary to integrally dispose in the proximity switch an oscillation circuit of which the oscillation amplitude varies depending on the distance from an object to be sensed to the switch.

In order to solve this problem, the inventors have devised a linear oscillation circuit, as shown in FIG. 3, as an example of the oscillation circuit which varies its oscillation amplitude in association with the distance of the object to be sensed. Although the circuit configuration of FIG. 3 does not belong to the prior art technology, for an easier understanding of the present invention, the linear oscillation circuit will be here described as a related art of the present invention.

The linear oscillation circuit comprises a constant current mirror circuit constituted with a constant current source $CS_0$ to generate a current $I_0$ and a current mirror circuit including transistors Tr4 and Tr5. Connected on an output side of the mirror circuit is a transistor Tr6 for an oscillation. The linear oscillation circuit further includes an LC oscillation circuit having a sense coil L and a capacitor C connected in parallel thereto, a bias current source $CS_1$, and a diode connecting transistor Tr1 as a bias circuit connected between the current source $CS_1$ and the LC resonance circuit. The transistor Tr1 has a collector linked to a base of the oscillation transistor Tr6. Furthermore, there is disposed a current mirror circuit for feeding back a current flowing through the transistor Tr6 to the parallel LC resonance circuit. The feedback current mirror circuit includes two transistors Tr2 and Tr3. When an upper end portion (an emitter Of the transistor Tr1) of the LC resonance circuit is set to a positive potential, the oscillation transistor Tr6 turns on to flow an output current $I_0$ equal to the current from the constant current source $CS_0$ through the transistor Tr6. The current $I_0$ is fed back via the current mirror circuit including the transistors Tr2 and Tr3 to the LC resonance circuit.

The oscillation circuit is of constant current feedback type, namely, the constant current $I_0$ is fed back to the LC resonance circuit. In consequence, the oscillation amplitude of this oscillation circuit, namely, a voltage $V_{RP}$ appearing across the LC resonance circuit is determined by the constant current $I_0$ and conductance g of the resonance circuit as follows.

$$V_{RP} = K \cdot I_0 / g \quad (1)$$

where, K is a proportional constant. Moreover, since $I_0$ and $V_{RP}$ of the expression (1) are values associated with an alternate current and hence may be regarded as effective values thereof.

Since the conductance value g varies depending on the distance l of an object Oj to be sensed, the oscillation amplitude $V_{RP}$ also varies in association with the distance l of an object Oj. This phenomenon is shown in FIG. 4. The oscillation voltage $V_{RP}$ is fed to a level discriminator (comparator) circuit so as to be discriminated by use of a predetermined level (having a hysteresis). As the object Oj approaches the sense coil L, the oscillation amplitude $V_{RP}$ decreases. When the amplitude $V_{RP}$ becomes equal to or less than the reference level, the proximity switch turns a sense signal on (sensing point, on point). A setting point is located at a position, as compared with the sensing point, slightly nearer to the sense coil L (e.g. 80% of the distance of the sensing or sense point as described above). Conversely, as the distance of the object Oj increases, the oscillation amplitude $V_{RP}$ becomes greater. Due to the hysteresis of the reference level, when the object Oj is at a position slightly further apart from the sensing point, the sense signal is turned off (off point).

Since the circuit of FIG. 3 is of a constant current feedback type, the change in the oscillation amplitude $V_{RP}$ depends only on the variation in the conductance of the LC resonance circuit. In consequence, when an LC resonance circuit having a small conductance variation is employed, it is impossible to attain a sufficient change in the oscillation amplitude (i.e. the graph of FIG. 4 has a small gradient) and hence the operation cannot be accomplished with a satisfactory stability.

SUMMARY OF THE INVENTION

It is therefore an object the present invention to provide an oscillation circuit for a proximity switch in which a large amplitude change can be developed even when an LC resonance circuit having a small conductance variation is employed.

In accordance with the present invention, there is provided an oscillation circuit of a proximity switch comprising; (a) a constant current mirror circuit, (b) an oscillation transistor for switching an output current from said constant current mirror circuit, (c) a parallel resonance circuit including a sense coil and a capacitor in parallel, (d) a current mirror circuit for feeding back a current flowing through said oscillation transistor to said parallel resonance circuit, (e) a direct-current bias generator circuit; (f) a bias circuit connected to said direct-current bias generator circuit and said parallel resonance circuit for supplying a bias voltage to said oscillation transistor, said oscillation transistor being controlled by a voltage developed by said bias circuit, and (g) a feedback current increase circuit including a feedback current increase transistor controlled by a voltage developed by said bias circuit and a resistor connected in series to said feedback current increase transistor, said feedback current increase circuit being connected in parallel to said oscillation transistor. The parallel resonance circuit is provided via said current mirror circuit with a feedback current obtained by adding a current flowing through said feedback current increase circuit to a current flowing through said oscillation transistor.

In accordance with the present invention, in addition to the effect of the change in the conductance of the parallel resonance circuit, the current flowing through the feedback current increase circuit is fed back to the parallel resonance circuit. Consequently, even if the change in the conductance of the parallel resonance circuit is small, a large variation can be attained in the oscillation amplitude. As a result, the proximity switch can operate with a stable characteristic.

Moreover, when the value of the resistance of the feedback current increase circuit is changed, the current value fed back to the parallel resonance circuit can be altered. In consequence, even when there are employed parallel resonance circuits having different conductance values, it is possible to attain the same oscillation characteristic. This means that a shared circuit may be used as a comparator circuit to be connected to a stage following the oscillation circuit, which is particularly advantageous when manufacturing an integrated circuit.

BRIEF DESCRIPTION OF THE DRAWINGS

These and other objects and advantages of the present invention will become apparent by reference to the following description and accompanying drawings wherein.

DESCRIPTION OF THE PREFERRED EMBODIMENTS

Figure 1:
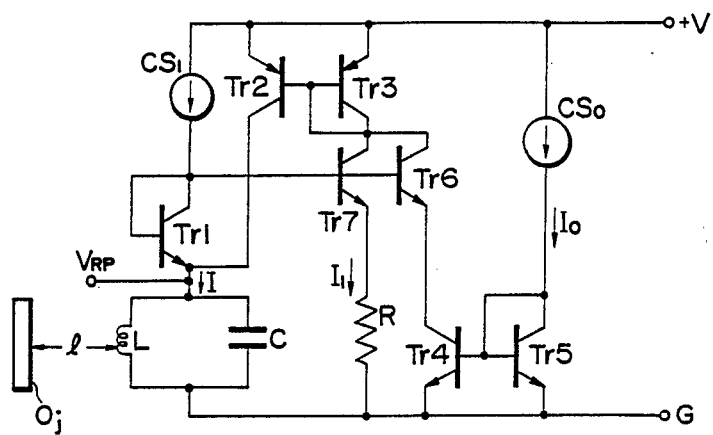
FIG. 1 is a schematic circuit diagram showing an embodiment according to the present invention.

Referring now to the drawings, description will be given of an embodiment of the present invention.

Figure 3:
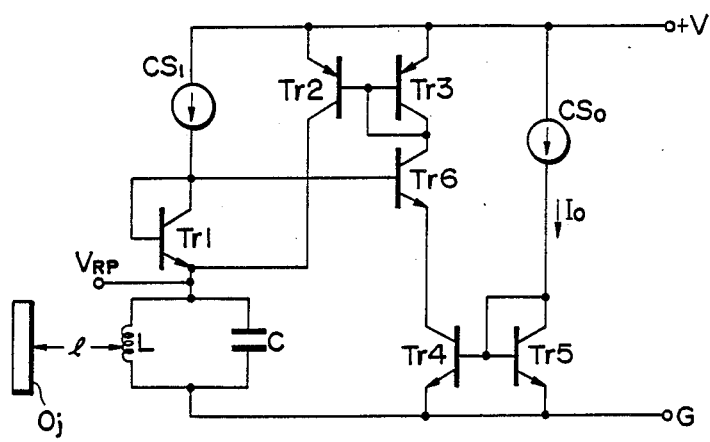
FIG. 3 is a circuit diagram showing an example of the oscillation circuit in a related art useful to explain the features of the present invention.
Figure 4:
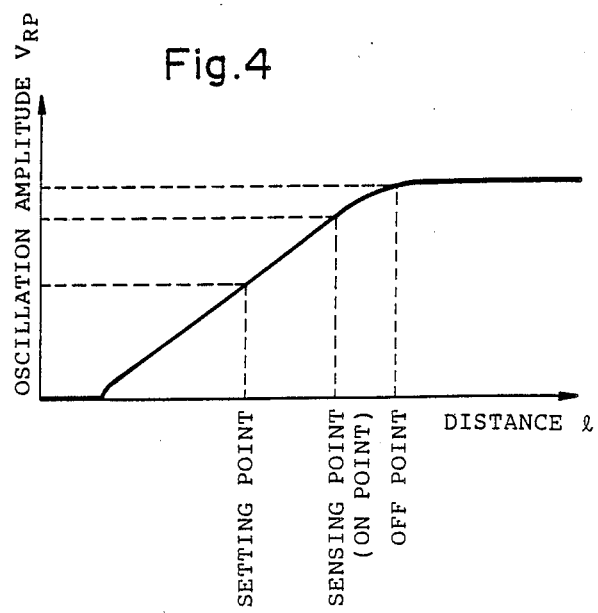
FIG. 4 is a graph showing a change in the oscillation amplitude of the circuit of FIG. 3.

FIG. 1 shows an embodiment in accordance with the present invention. In this configuration, the same constituent elements as those of FIG. 3 are assigned with the same reference numerals.

In the circuit of FIG. 1, an oscillation transistor Tr6 for an oscillation is connected in parallel to a feedback current increase transistor Tr7, which has a base to be controlled by the potential of a collector of the transistor Tr1 constituting a bias circuit. Connected between an emitter of the transistor Tr7 and a ground G is a resistor R. A current $I_1$ flowing in the transistor Tr7 is determined by the values of the emitter potential (substantially identical to an output voltage $V_{RP}$ from the LC resonance circuit) and the resistor R. That is, there is attained a relationship of $I_1 = V_{RP}/R$.

Since the feedback current mirror circuit is driven by the constant current $I_0$ flowing through the transistor Tr6 and the current $I_1$ passing through the transistor Tr7, a resultant or total current I obtained by adding $I_0$ to $I_1$ is fed back to the LC resonance circuit.

In consequence, the oscillation amplitude $V_{RP}$ of the LC resonance circuit is represented as follows.

$$V_{RP} = I/g = (I_0 + I_1)/g = (I_0 + V_{RP}/R)/g \quad (2)$$

Namely, from the expression (2), $$V_{RP} = I_0/[g - (1/R)] \quad (3)$$

is obtained.

Figure 2:
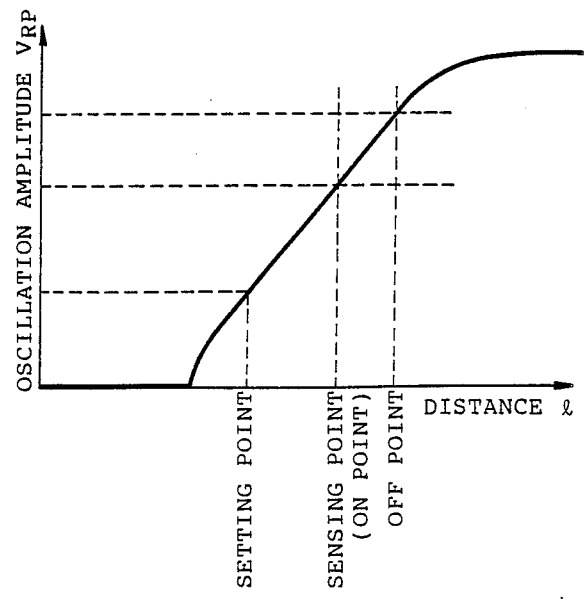
FIG. 2 is a graph schematically showing a change in the oscillation amplitude of the embodiment of FIG. 1.

FIG. 2 shows a change in the oscillation amplitude of the oscillation circuit configured as above. Since the current $I_1$ determined by the resistance R is additionally fed back to the parallel LC resonance circuit, even if the change in the conductance g is small, the oscillation amplitude $V_{RP}$ develops a large variation (gradient) and hence the proximity switch operates with a stable operation characteristic.

In addition, even when there are adopted two oscillation circuits having parallel LC resonance circuits with different conductance values, by adjusting the output current $I_0$ from the constant current source $CS_0$ and the resistance R, it is possible to obtain substantially the same oscillation characteristics for these oscillation circuits. That is, a shared circuit may be used as a comparator (level discriminator) circuit to be connected in the subsequent stage, which facilitates to share circuit components. This is particularly advantageous when manufacturing an integrated circuit.

Figure 5A:
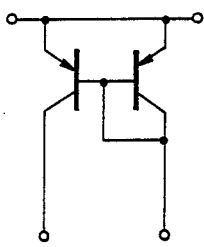
FIGS. 5a to 5e are circuit diagrams showing various types of current mirror circuits.
Figure 5B:
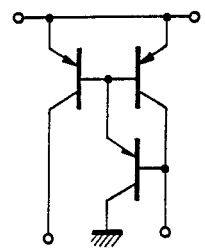
Figure 5C:
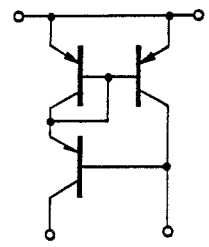
Figure 5D:
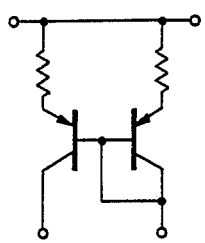
Figure 5E:
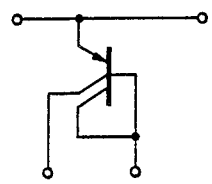

In the embodiment above, two current mirror circuits are used. These circuits are of a type shown in FIG. 5a (regardless of the transistor types such as the pnp and npn types). As these current mirror circuits, there may naturally be adopted a circuit of a base current compensation type of FIG. 5b, a Wilson mirror circuit of FIG. 5c, a circuit disposed with resistors as shown in FIG. 5d, and a mirror circuit having a split collector structure of FIG. 5e.

While the particular embodiments of the invention have been shown and described, it will be obvious to those skilled in the art that various changes and modifications may be made without departing from the present invention in its broader aspects.

We claim:

1. An oscillation circuit cf a proximity switch comprising:
    (a) a constant current mirror circuit;
    (b) an oscillation transistor for switching an output current from said constant current mirror circuit;
    (c) a parallel resonance circuit including a sense coil and a capacitor in parallel;
    (d) a current mirror circuit for feeding back a current flowing through said oscillation transistor to said parallel resonance circuit;
    (e) a direct-current bias generator circuit;
    (f) a bias circuit connected to said direct-current bias generator circuit and said parallel resonance circuit for supplying a bias voltage to said oscillation transistor, said oscillation transistor being controlled by a voltage developed by said bias circuit; and
    (g) a feedback current increase circuit including a feedback current increase transistor controlled by a voltage developed by said bias circuit and a resistor connected in series to said feedback current increase transistor, said feedback current increase circuit being connected in parallel to said oscillation transistor,
    a current obtained by adding a current flowing through said feedback current increase circuit to a current flowing through said oscillation transistor being fed back via said current mirror circuit to said parallel resonance circuit.

2. An oscillation circuit of a proximity switch comprising :
    a parallel LC resonance circuit;
    an oscillation transistor controlled by an output voltage from said resonance circuit for switching a constant current;
    a feedback circuit for feeding back a current flowing through said oscillation transistor to said resonance circuit; and a feedback current increase circuit including a second transistor controlled by an output voltage from said resonance circuit and a resistor connected in series to said second transistor;

said resonance circuit being supplied via said feedback circuit with a feedback current obtained by adding a current flowing through said feedback current increase circuit and a current passing through said oscillation transistor.

* * * * *